United States Patent [19]

Nicholls et al.

[11] Patent Number: 5,422,308

[45] Date of Patent: Jun. 6, 1995

[54] METHOD OF FABRICATING A TUNGSTEN CONTACT

[75] Inventors: Howard C. Nicholls; Michael J. Norrington, both of Cardiff; Michael K. Thompson, Newport, all of United Kingdom

[73] Assignee: Inmos Limited

[21] Appl. No.: 161,570

[22] Filed: Dec. 6, 1993

Related U.S. Application Data

[60] Division of Ser. No. 739,381, Aug. 1, 1991, abandoned, which is a continuation of Ser. No. 502,526, Mar. 30, 1990, abandoned.

[30] Foreign Application Priority Data

Apr. 7, 1989 [GB] United Kingdom ............... 8907898

[51] Int. Cl.⁶ .................................... H01L 21/441
[52] U.S. Cl. .................................... 437/192; 437/34; 437/978
[58] Field of Search ................ 437/34, 192, 978; 148/DIG. 43, DIG. 112, DIG. 114, DIG. 17

[56] References Cited

U.S. PATENT DOCUMENTS

| | | | |
|---|---|---|---|
| 4,028,717 | 6/1977 | Joy et al. | 257/404 |
| 4,169,270 | 9/1979 | Hayes | 257/387 |
| 4,271,582 | 6/1981 | Shirai et al. | 437/247 |
| 4,385,308 | 5/1983 | Uchida | 257/326 |
| 4,507,853 | 4/1985 | McDavid | 437/194 |
| 4,520,041 | 8/1985 | Aoyama et al. | 437/187 |
| 4,560,582 | 12/1985 | Ichikawa | 437/29 |
| 4,592,802 | 6/1986 | Deleonibus et al. | 437/192 |

(List continued on next page.)

FOREIGN PATENT DOCUMENTS

| | | |
|---|---|---|
| 8928 | 3/1980 | European Pat. Off. . |
| 1208030 | 10/1970 | United Kingdom . |
| 1574582 | 9/1980 | United Kingdom . |
| 2206234 | 12/1988 | United Kingdom . |

OTHER PUBLICATIONS

C. Kaanta, et al., "Submicron Wiring Technology with Tungston and Planarization", IEDM Conference Proceedings, *IEEE*, 9.3, pp. 209–212 (1987).

R. Blewer, et al., "Conditions for Tunnel Formation in LPCVD Tungston Films on Single Crystalsilicon", *Materials Research Society*, pp. 115–122 (1988).

E. Broadbent, et al. "Some Recent Observations on Tunnel Defect Formation During High Temperature Post–Deposition Anneal of CVD W on Si", *Materials Research Society*, pp. 111–113 (1988).

R. Blewer, et al., "Detrimental Effects of Residual Silicon Oxides on LPCVD Tungsten Depositions in Shallow Junction Devices", *Materials Research Society*, pp. 235–246 (1987).

(List continued on next page.)

*Primary Examiner*—Brian E. Hearn
*Assistant Examiner*—Chandra Chaudhari
*Attorney, Agent, or Firm*—Willian Brinks Hofer Gilson & Lione

[57] ABSTRACT

A method of fabricating a tungsten contact in a semiconductor device comprises providing an oxide layer on a region of a silicon substrate; depositing a sealing dielectric layer over the oxide layer; and depositing an interlevel dielectric layer over the sealing layer. The interlevel dielectric layer, the sealing dielectric layer and the oxide layer are then etched through as far as the substrate thereby to form a contact hole and to expose the said region. A dopant is implanted into the said region whereby the implanted dopant is self-aligned to the contact hole. The substrate is thermally annealed. Tungsten is selectively deposited in the contact hole and an interconnect layer is deposited over the deposited tungsten contact. The invention also provides a semiconductor device which incorporates a tungsten contact and which can be fabricated by the method.

27 Claims, 3 Drawing Sheets

U.S. PATENT DOCUMENTS

| | | | |
|---|---|---|---|
| 4,710,241 | 12/1987 | Komatsu | 437/162 |
| 4,740,883 | 4/1988 | Tobin | 148/DIG. 112 |
| 4,764,248 | 8/1988 | Bhattacherjee et al. | 437/61 |
| 4,764,484 | 8/1988 | Mo | 437/192 |
| 4,878,096 | 10/1989 | Shirai et al. | 257/338 |
| 5,231,055 | 7/1993 | Smith | 437/192 |

OTHER PUBLICATIONS

J. T. Clemens, "NMOS Technology—A Review", The Electrochemical Society, *Extended Abstracts*, vol. 79-2, pp. 812-814 (1979).

V. V. S. Rana, et al. "Selective Tungston Plugs on Silicon for Advanced CMOS Devices" *Technical Digest of the International Electron Devices Meeting*, Dec. 6, 1987, IEEE, Washington D.C., pp. 862-864.

S. Sachdev et al. "Blanket Tungston Applications in VLSI Processing", 1985 *Materials Research Society*, pp. 475-482.

S. M. Sze, "Semiconductor Devices Physics and Technology", John Wiley & Sons, New York (1985) pp. 113, 360-361.

METHOD OF FABRICATING A TUNGSTEN CONTACT

BACKGROUND OF THE INVENTION

This patent is a divisional application of application Ser. No. 07/739,381, filed on Aug. 1, 1991, now abandoned, which is a Continuation of U.S. Ser. No. 07/502,526, filed Mar. 30, 1990, now abandoned.

The present invention relates to semiconductor devices and fabrication thereof. In particular, the present invention relates to a method of fabricating a tungsten contact in a semiconductor device and to a semiconductor device incorporating such a tungsten contact.

In the manufacture of the semiconductor devices it is necessary to provide electrically conductive contacts and interconnect layers in order to connect electrically various parts of the device to each other and to external circuitry. Manufacturers of semiconductor devices have appreciated that there is a need further to reduce the size of the devices by, inter alia, reducing the size of the electrical contacts and also the interconnect pitch, without reducing the reliability of the devices and while still keeping the surface planar so that subsequent interconnect layers can be formed. Conventional methods of depositing metal contacts, such as by sputtering, have great difficulty in depositing enough material into the contact holes in order to form reliable electrical connections between the substrate silicon and the metal contact. In addition, the resulting topology is non-planar and can place severe constraints on the complexity of the interconnect layers. These technical problems are particularly encountered in the manufacture of CMOS devices which may require multiple interconnect layers.

A typical conventional CMOS device as shown in FIG. 1 which is a cross-section through a CMOS device. In this known device 2, metal contacts 4 are provided to connect the sources and drains 6,8 of the device 2 to interconnect layers such as metal interconnect layer 10 which defines a bonding pad 12 for connection to external circuitry. The metal contacts 4 are disposed in contact holes 14 defined in the dielectric layers comprised of the field oxide layer 16 the interlevel dielectric layer 18, and the gate oxide layer 22. The method of manufacturing this known device has the limitation that the contact hole 14 must be wide enough and have the correct profile (i.e. it is wider at the too than at the bottom) to allow a limited amount of metal to enter the contact hole 14 thereby to form the contact 4. The obtainable reduction in size of the contact hole is limited by the step coverage capability of conventional sputtering systems. In addition, the metal line width has to he large enough to cover the contact by at least the possible misalignment of the pattern so that the contact is protected during plasma etching of the metal to form the desired patterning of the interconnect layer. Furthermore, making the contact hole large, any subsequent dielectric layer not only has to be capable of covering the non-planar surface resulting from previous interconnect layers but also has to cover the profile of the metal when it goes down into a contact hole. This requires an involved technique for planarising the next dielectric layer which must be used if further interconnect layers are required. From FIG. 1 it will be seen that in the resultant structure the upper surface of the top dielectric layer 20 is non-planar in the region of the metal contacts 4 and it will also be seen that the width of the metal contacts formed is substantially greater than the width of the corresponding source and drain regions of the semiconductor device which are not covered by the gate and field oxide layers 22,16.

It has been proposed to use tungsten plug technology as a means to enhance semiconductor device planarization and to reduce interconnect pitch design rules. For example, in a paper entitled "Submicron wiring technology with tungsten and planarization" (by C. Kaanta, W. Cote, J. Cronin, K. Holland, P. Lee, and T. Wright, IEDM Conference Proceedings, 9.3, p. 209, 1987) it is disclosed that vercial contact studs can be formed from tungsten. However, it is known that such tungsten plug technology suffers substantial technical problems which are related to the agressive chemistry of the selective tungsten deposition process. In this process, tungsten is deposited by chemical vapour deposition (CVD) and the deposition is auto-catalyzed on silicon or metal surfaces and hence tungsten only deposits in contact holes which have silicon (or tungsten) exposed and not on the dielectric itself. The agressive flourine chemistry can also cause significant damage to the silicon interface and to the source/drain junction. It is well known that particular problems which can occur in the known tungsten plug technology are the phenomenon of tunnelling (which is the formation of microscopic filamentary voids in the silicon beneath the chemically vapour deposited tungsten); encroachment of the tungsten underneath the silicon/dielectric interface; consumption of the silicon by the tungsten thereby lowering the tungsten/silicon interface; and high contact resistances (especially for p+—doped silicon substrates) in the source/drain regions. A paper entitled "Conditions for tunnel formation in LPCVD tungsten films on single crystal silicon" (by R. Blewer, T. Headley and M. Tracy, Tungsten and Other Refractory Metals for VLSI Applications, ed. V. Wells, MRS Pittsburgh Pa., p. 115, 1987), a paper entitled "Some recent observations on tunnel defect formation during high temperature post-deposition anneal of CVD) W on Si" (by E. Broadbent, D. Sadana, A. Morgan, J. Flanner and R. Ellwanger, Workshop on Tungsten and Other Refractory Metals for VLSI Applications, ed. V. Wells, MRS Pittsburgh Pa., P. 111, 1987) and a paper entitled "Detrimental effects of residual silicon oxides on LPCVD tungsten depositions in shallow junction devices" (by R. Blewer and M. Tracy, Workshop on Tungsten and Other Refractory Metals for VLSI Applications, ed. E. Broadbent, MRS Pittsburgh Pa., p. 235, 1986) all disclose specific problems which can be encountered in the deposition of tungsten on silicon. These articles suggest procedures for reducing the occurrence of the defects in the silicon which can occur on CVD tungsten deposition. For example, it has been suggested carefully to choose the operating regimes in the CVD reactor and to control the gas purity. It has also been noted that precleaning of the silicon surface can reduce the occurrence of defects in the silicon. However, the prior art fails to teach a method of fabricating a tungsten contact in the semiconductor device which can properly control the occurrence of defects such as tunnelling, encroachment of tungsten underneath the silicon/dielectric interface, consumption of the silicon and high contact resistances without compromising the inherent advantages of tungsten plug processing in a viable manufacturing technique.

British Patent Specification No. 2206234 discloses a multi-layer metallisation method for integrated circuits in which a metal sandwich structure of refractory metal/aluminium/refractory metal or alloy is deposited onto a semiconductor substrate. The refractory metal is titanium or an alloy of titanium and tungsten. Portions of the sandwich structure are removed to form interconnect and bonding pad conductors.

British Patent Specification No. 1574582 discloses a method of making a surface barrier connection to a piece of semiconductor material in which a contact metal layer is deposited over an oxide layer on a silicon substrate. The oxide layer has a window exposing the silicon substrate. The contact metal is reacted with the silicon to form a silicide.

British Patent Specification No. 1208030 discloses a semiconductor device having metal layers contacting regions of a silicon substrate. The metal layers extend through holes in an insulating film including a lower insulating layer, a middle glass layer and an upper insulating layer. The glass layer is composed of phosphorous oxide.

SUMMARY OF THE INVENTION

The present invention aims at least partially to overcome the above specified problems of the prior art.

The present invention accordingly provides a method of fabricating a tungsten contact in a semiconductor device, which method comprises the steps of:

(a) providing an oxide layer on a region of a silicon substrate;
(b) depositing a sealing dielectric layer over the oxide layer;
(c) depositing an interlevel dielectric layer over the sealing layer;
(d) etching through the interlevel dielectric layer, the sealing dielectric layer and the oxide layer as far as the substrate thereby to form a contact hole and to expose the said region;
(e) implanting a dopant into the said region whereby the implanted dopant is self-aligned to the contact hole;
(f) thermally annealing the substrate;
(g) selectively depositing tungsten in the contact hole; and
(h) depositing an interconnect layer over the deposited tungsten contact.

Preferably, the semiconductor device is a CMOS device, and a plurality a method according to any foregoing claim wherein the semiconductor device is a CMOS device, and wherein a plurality of the tungsten contacts are fabricated over a corresponding number of the said regions, the said regions being divided into pairs of such regions, each pair of regions defining a source and a drain for a respective semiconductor element, and wherein a polysilicon gate is deposited on the said oxide layer between each pair of source and drain regions.

More preferably a first pair of source and drain regions is initially doped with an N+dopant and is disposed in a P-doped well in the substrate which is N-doped, and during the implantation step (e) an N-dopant is implanted into the first pair of source and drain regions, and a second pair of source and drain regions is initially doped with a P+dopant and is disposed in the N-doped substrate, and during the implantation step (e) a P-dopant is implanted into the second pair of source and drain regions.

The present invention also provides a semiconductor device incorporating a tungsten contact, the device including a silicon substrate having a region doped with a dopant; a tungsten contact disposed on the region and extending upwardly away therefrom, the tungsten contact being disposed in a contact hole which is defined in a series of dielectric layers comprising a bottom layer of oxide on the substrate, a sealing layer on the oxide layer, the sealing layer acting to seal the underlying oxide layer, and an interlevel layer on the sealing layer; and an interconnect layer which is disposed over the tungsten contact.

The said region may constitute part of a field effect transistor.

Preferably, the semiconductor device is a CMOS device and the device incorporates a plurality of the tungsten contacts which are each disposed on a respective one of a corresponding plurality of the regions, the said regions being divided into pairs of such regions, each pair of regions defining a source and a drain for a respective semiconductor element, and wherein a polysilicon gate is disposed on the said oxide layer between each pair of source and drain regions.

The present invention further provides a method of fabricating a tungsten contact in a semiconductor device, which method comprises the steps of:

(a) providing an oxide layer on a region of a silicon substrate;
(b) depositing a dielectric layer over the oxide layer;
(c) etching through the dielectric layer and the oxide layer as far as the substrate thereby to form a contact hole and to expose the said region;
(d) implanting a dopant into the said region whereby the implanted dopant is self-aligned to the contact hole:
(e) thermally annealing the substrate;
(f) selectively depositing tungsten in the contact hole; and
(g) depositing an interconnect layer over the deposited tungsten contact.

BRIEF DESCRIPTION OF THE DRAWINGS

An embodiment of the present invention will now be described by way of example only with reference to the accompanying drawings in which.

DETAILED DESCRIPTION OF THE PREFERRED EMBODIMENTS

Figure 1:
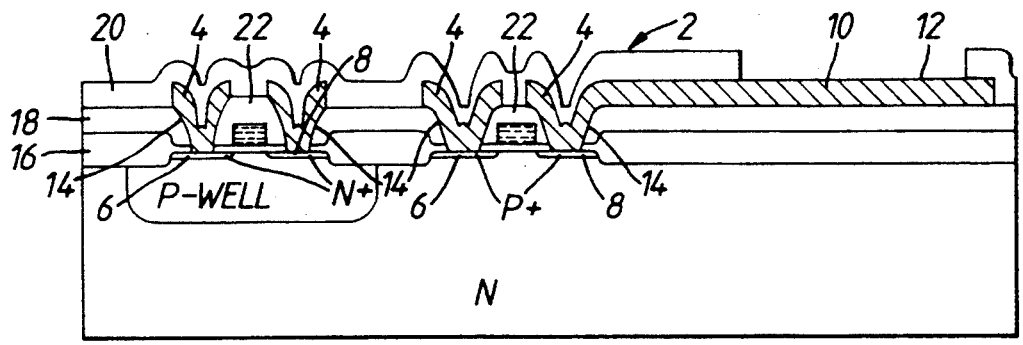
FIG. 1 is a section through a known CMOS semiconductor device.
Figure 2:
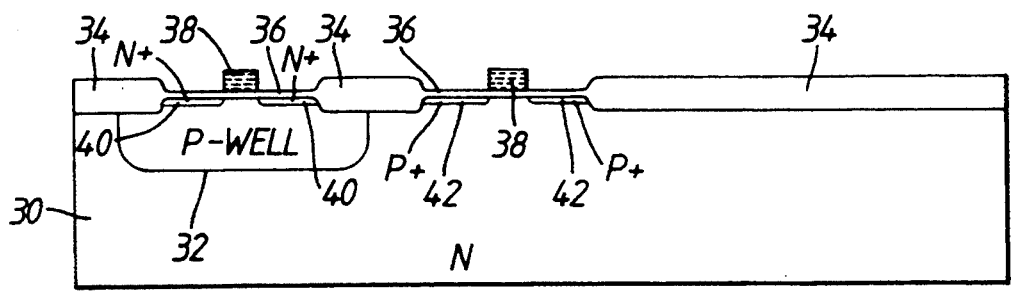
FIG. 2 shows a section through a silicon wafer structure in a CMOS process after polysilicon gates have been deposited onto respective gate oxide layers which cover respectively doped regions of the silicon between regions of field oxide.

Referring to FIG. 2, there is shown a section through a silicon wafer structure after conventional CMOS processing. The structure comprises a substrate 30 of N-doped silicon in which a P-well 32 has been defined by implantation and well drive in of a p-dopant such as boron. Regions 34 of field oxide are grown on the silicon layer 30 and a gate oxide layer 36 is grown over the silicon layer 30 between the field oxide regions 34. Subsequently, polysilicon gates 38 are formed on the gate oxide layer 36. A sequence of masking and dopant implantation steps is carried out to define N+—source and drain regions 40 in the P-well 32 and P+—source and drain regions 42 in the N-doped substrate 30. The gates 38 are also doped with the appropriate N- or P-dopant as the case may be. It should be noted that this conventional CMOS processing is independent of the choice of CMOS structure, which may be N-well, P-well or twin-well, and is independent of the transistor formation and the isolation formation.

Figure 3:
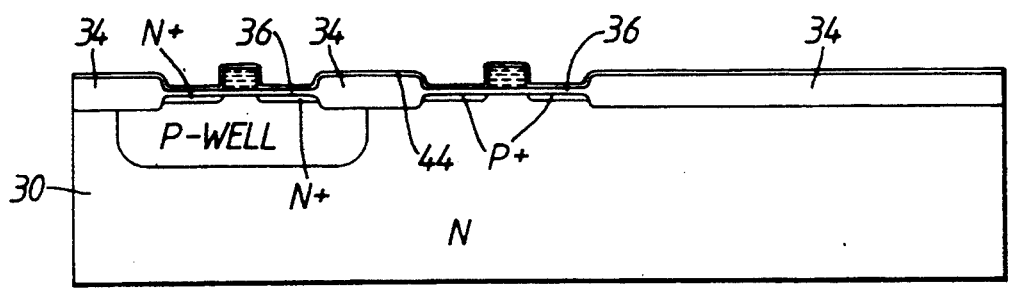
FIG. 3 shows a structure of FIG. 2 after deposition of a sealing dielectric layer.
Figure 4:
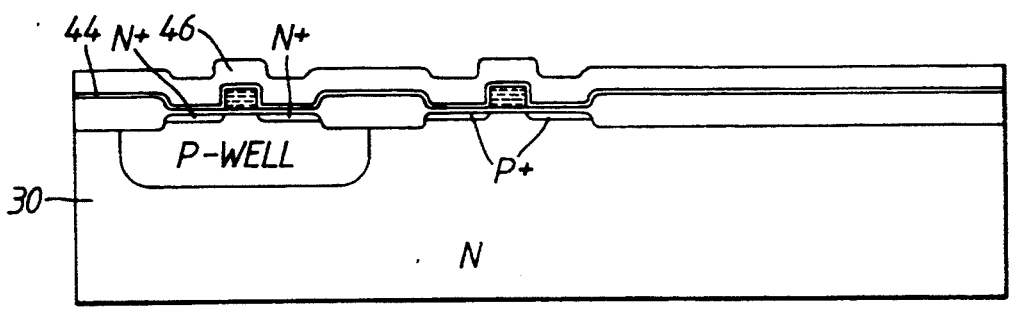
FIG. 4 shows a structure of FIG. 3 after the deposition of an interlevel dielectric layer over the sealing layer.

Referring now to FIG. 3, in accordance with the present invention a sealing dielectric layer 44 is deposited over the oxide layer which comprises the field oxide 34 and the gate oxide 36. The sealing dielectric layer 44 comprises a CVD silicon nitride layer having a thickness of from 200 to 600 A. Typically, the silicon nitride layer 44 is deposited at a pressure of from 290 to 350 millitor and at a temperature of 750° C.) using SiCl$_2$H$_2$ and NH$_3$ to produce a layer having a refractive index of 2.00±0.05. As is shown in FIG. 4, an interlevel dielectric layer 46 is subsequently deposited over the silicon nitride layer 44. The interlevel dielectric layer 46 must be composed of a material which is compatible with subsequent selective tungsten processing, i.e. it must not promote the growth of tungsten on its surface. A preferred interlevel dielectric material is borophosphosilicate glass (BPSG) deposited at atmospheric pressure and at a temperature of 450° C. using O$_2$, SiH$_4$, B$_2$H$_6$, and PH$_3$ to give a layer with 3% boron concentration and 5% phosphorus concentration. The BPSG interlevel dielectric is reflowable and after deposition of the interlevel dielectric layer 46 the composite structure is subjected to dielectric densification and reflow by heating the structure at a temperature of at least 900° C. for at least 30 minutes, This heating step provides the multiple function of repairing and annealing out any damage in the silicon caused by previous implantations; sealing the nitride/silicon interface; and densifying the dielectric layer.

Figure 5:
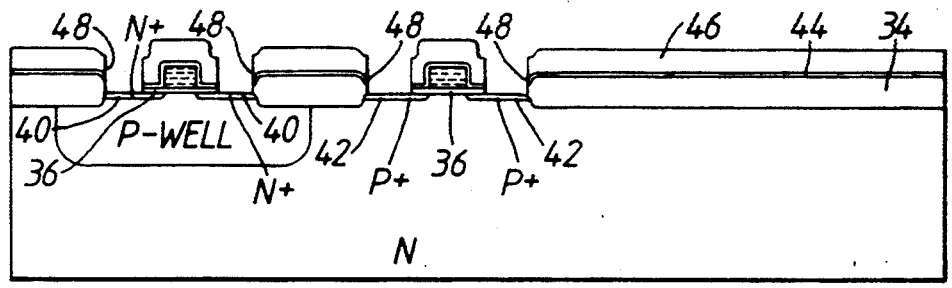
FIG. 5 shows the structure of FIG. 4 after reflow of the interlevel dielectric layer and the etching of contact holes.

Subsequently, a photoresist pattern is formed over the interlevel dielectric layer 46 which selectively exposes areas of the interlevel dielectric layer 46 in which the tungsten contacts are subsequently to be formed. The structure is then etched by means of any suitable plasma etch system capable of anisotropically etching silicon dioxide with a selectivity to silicon of greater than 7:1. A preferred etch involves a 7:1 H$_2$O:HF did for 60 seconds to clean the surface of the exposed BPSG followed by a C$_2$F$_6$/CHF$_3$ plasma etch. This etching step etches down through the interlevel dielectric layer 46, the sealing dielectric layer 44, and the gate oxide layer 36 as far as the silicon substrate thereby to form contact holes 48 in the series of dielectric layers which contact holes 41 are aligned with the source and drain regions 40,42. The resultant structure is shown in FIG. 5. The etching step exposes the source and drain regions 40, 42 of the substrate 30 and the P-well 32. The contact hole 48 has substantially vertical sides as is shown in FIG. 5.

Figure 6:
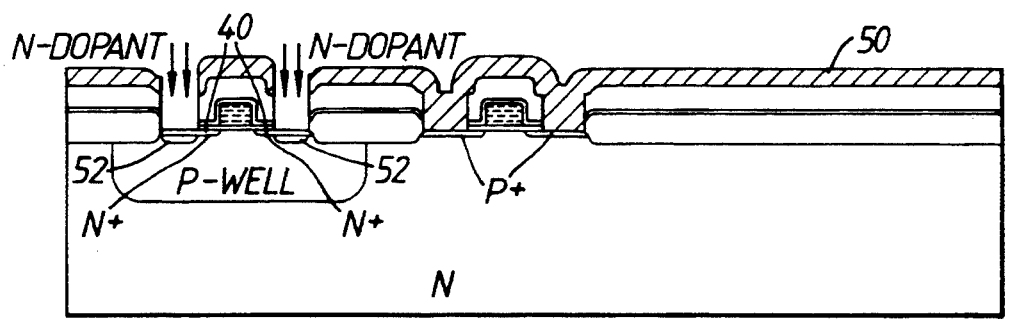
FIG. 6 shows the structure of FIG. 5 after the deposition of photoresist pattern and during implantation of an N-dopant into N+—doped sources and drains.

Referring now to FIG. 6, a photoresist pattern 50 is formed over the structure of FIG. 5, the photoresist pattern 50 exposing all of the areas of N+—silicon 40. A N-dopant (e.g. phosphorous) enhancement implant is then carried out. This implant increases the junction depth and the N-type dopant surface concentration to give an increased tolerance to damage during subsequent processing and to lower the N+—contact resistance respectively. The implant is self-aligned to the ultimate tungsten contact since the sides of the contact hole 48 define the lateral dimensions of the implanted regions, The enhanced implanted regions 52 are shown in FIG. 6. The photoresist pattern 50 is then removed.

Figure 7:
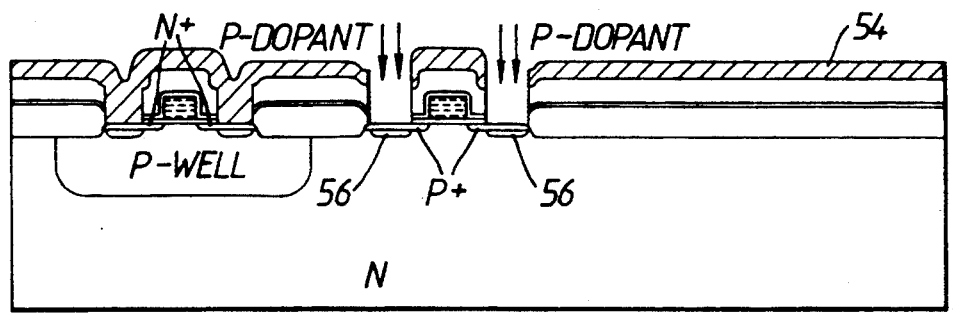
FIG. 7 shows the structure of FIG. 6 after removal of the photoresist pattern of FIG. 6 and subsequent application of a second photoresist pattern and during implantation of a P-dopant into P+—doped regions of the silicon.

Referring to FIG. 7, a further photoresist pattern 54 is then formed over the structure and the photoresist pattern 54 exposes all the areas of P+—silicon 42. A P-dopant (e.g. boron) is then implanted as an enhancement implant into the exposed areas of the P+—silicon 42 thereby to provide implanted regions 56 which are self-aligned to the ultimate tungsten contacts. Again, the enhancement implant increases the junction depth and the P-dopant surface concentration to give a tolerance to damage during subsequent processing and to lower the P+—contact resistance respectively. The photoresist pattern 54 is then removed. A preferred final step for this photoresist removal consists of an oxygen-containing plasma treatment to remove residual polymer.

The resultant structure is then subjected to a rapid thermal anneal at a temperature high enough to repair any damage to the silicon which may have resulted from the implants and low enough to retain near-vertical contact well profiles. The preferred process is a rapid thermal anneal at a temperature of about 1035° C. for 5 seconds in an argon atmosphere.

The next stage in the processing is the precleaning of the exposed regions of the silicon prior to selective tungsten deposition. The exposed regions of silicon are precleaned initially by treatment with an organic removing agent such as sulphuric acid or nitric acid. The exposed regions are then further precleaned preferably by treatment with hydrofluoric acid which has been buffered with ammonium fluoride in a ratio of at least 1:40 for at least 3 minutes. A final pretreatment step of H$_2$ or NF$_3$ in a plasma environment at a pressure of less than 500 mTorr and a temperature of less than 450° C. can be carried out immediately before deposition to act as a final preparation of the surface. Deposition should then take place following this step without breaking the vacuum.

Figure 8:
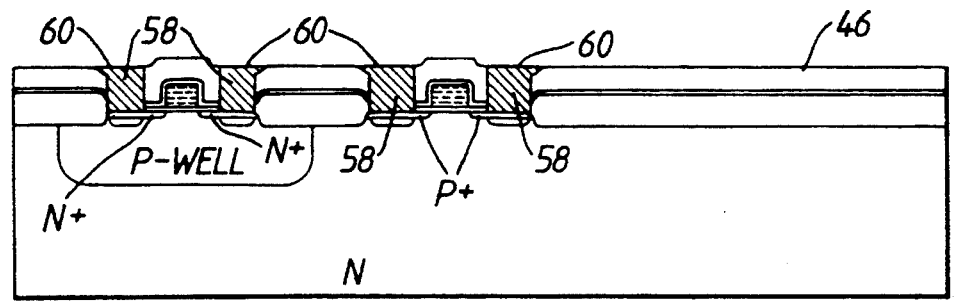
FIG. 8 shows the structure of FIG. 7 after removal of the second photoresist pattern, a rapid thermal anneal, and selective CVD tungsten deposition in the contact holes.

Subsequently, CVD tungsten is selectively deposited in the contact holes 48 in order to fill the holes and to planarize them, i.e. the upper surface of the tungsten plugs is substantially aligned with the upper surface of the dielectric. The resultant structure is shown in FIG. 8 in which tungsten contacts 58 having planar upper surfaces 60 are disposed in the contact holes 48. A preferred CVD tungsten deposition process is carried out at a temperature of about 230° C. and at a pressure of less than 250 millitorr using $WF_6$, $SiH_4$ and $H_2$. Preferably, both the $WF_6$ and the $SiH_4$ partial pressures are less than 3% of the total pressure.

Figure 9:
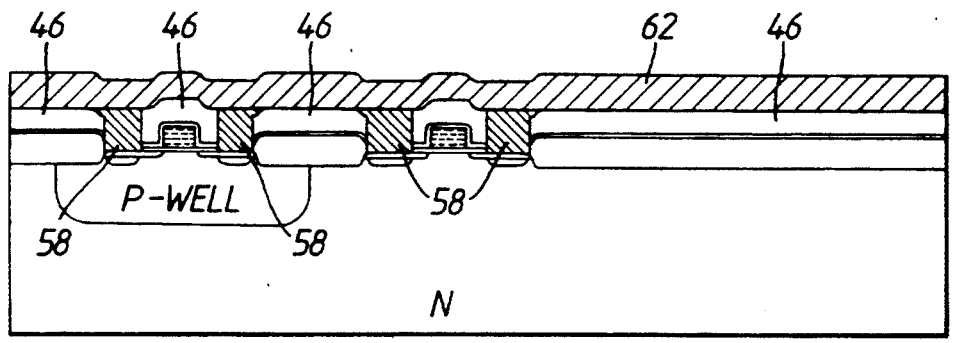
FIG. 9 shows the structure of FIG. 8 after deposition of a metal interconnect layer.
Figure 10:
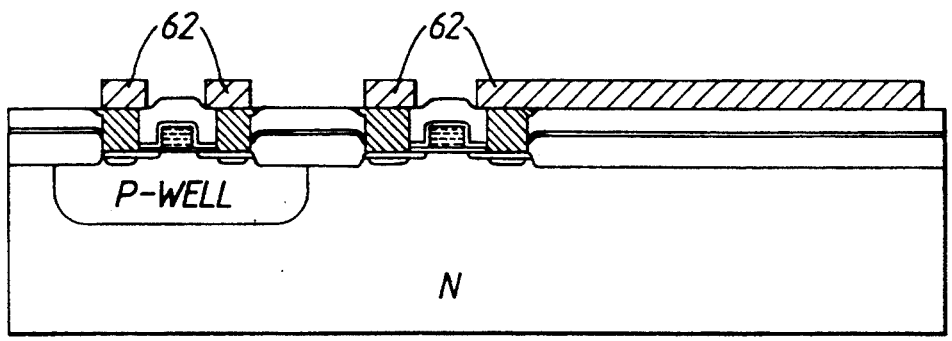
FIG. 10 shows the structure of FIG. 9 after patterned etching of the interconnect layer.

As is shown in FIG. 9, the next step is the deposition over the interlevel dielectric layer 66 and the tungsten contacts 58 of a metal interconnect layer 62. The metal interconnect layer 62 may be deposited by conventional sputtering methods. Next, a photoresist pattern is formed on the metal interconnect layer 62 which covers areas which are to form the ultimate patterned interconnect layer underneath which are disposed the tungsten contacts 58 which connect to the silicon. The metal interconnect layer 62 is then anisotropically etched in any plasma etch system which is capable of etching the metal with a selectivity to silicon dioxide and tungsten which is sufficient to remove less than 2000 A of either material. The photoresist is then removed. The resultant structure is shown in FIG. 10 in which respective portions of the patterned metal interconnect layer 62 are disposed over respective tungsten contacts 58.

Figure 11:
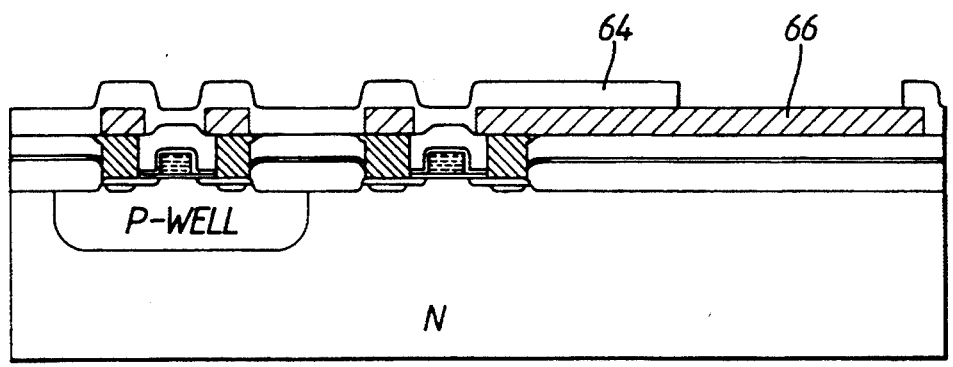
FIG. 11 shows the structure of FIG. 10 after subsequent deposition of a patterned dielectric layer over the metal interconnect layer.

The remaining steps to manufacture this semiconductor device are standard CMOS process steps and include the deposition over the metal interconnect layer 62 of a top layer of oxide 64 which defines a bonding pad 66 of the metal interconnect layer 62. The structure of the resultant FET semiconductor device is shown in FIG. 11.

By employing the process stems described above, the present inventors have discovered that the encroachment of tungsten underneath the dielectric/silicon interface is minimized and also that the consumption of silicon and damage to the silicon resulting from the tungsten deposition can also be minimized.

As far as silicon encroachment is concerned, this phenomenon is characterised by a lateral growth of deposited tungsten along the relatively high energy boundary between the oxide layer and the silicon substrate. Such encroachment can lead to electrical shorting by the tungsten formed between laterally adjacent structures of the semiconductor device. The present inventors have discovered surprisingly that the presence of a silicon nitride layer, which acts as a sealing and barrier layer, in the region of the junction of the oxide and the silicon reduces the tendency for lateral encroachment of the tungsten at the bottom of the contact hole. Without wishing to be bound by theory, the present inventors believe that the mechanism of tungsten encroachment, and the reason why the silicon nitride layer can assist reduction of the encroachment phenomenon are as follows. Tungsten encroachment requires rapid diffusion of tungsten fluorides (which may be in the form of subfluorides) along the oxide/silicon interface. The tungsten fluorides react with the silicon to form tungsten. The sealing harrier dielectric layer of silicon nitride resists mechanical deformation and accordingly modifies the resulting stress in the layers, thus causing a reduction in the diffusion of fluorides along the interface and hence a reduction in the encroachment of tungsten. The sealing barrier dielectric layer has high stress so that the accumulative stress in the layers inhibits diffusion along the silicon/oxide interface. The interlevel dielectric layer of BPSG, also resists the mechanical deformation of the sealing dielectric layer. The result is that the encroachment of tungsten can be limited to about 0.1 μm which is about the same distance as the depth of silicon consumption beneath the tungsten plug.

The sealing dielectric layer of the illustrated embodiment is silicon nitride. However, the sealing dielectric layer may be composed of other substances having high density and a high dielectric constant. The sealing dielectric layer must be compatible with the silicon, oxide, tungsten and interlevel interconnect to which it is adjacent and must provide mechanical resistance as described above, to diffusion of fluorides along the interface by modifying the stress in the films. The sealing dielectric layer should be resistant to mechanical deformation but not brittle and it should also have a low diffusion coefficient to gases such as hydrogen, fluorine and gaseous fluorides. The sealing dielectric layer may alternatively be comprised of $TiO_2$, $WO_2$, $ZrO_2$, $HfO_2$ or other insulating refractaries or rare earth metal oxides which have the physical characteristics referred to above.

In addition, the rapid thermal anneal step tends to remove any implantation damage in the silicon at the bottom of the contact hole and it is believed that this reduces the energy at the oxide/silicon interface which again minimizes encroachment of the tungsten at the interface.

As far as minimization silicon consumption and damage to the silicon is concerned, the present inventors believe that this is at least partially achieved by the implantation steps and the rapid thermal anneal step. With the n-dopant implant (i.e. phosphorous), the implant causes the N+ —regions to be deeper and in addition the rapid thermal anneal causes driving-in of the N-dopant implant. The result of this is that even if some of the silicon of the N+ —region 40 is consumed by the tungsten durinq tungsten deposition, nevertheless the N+ —implant is sufficiently deep so as not substantially to be affected by the tungsten thereby affecting the subsequent operation of the source/drain regions. Typically, the junction depth is about 0.25 μm whereas about 0.1 μm of silicon is removed by the tungsten deposition. The implant ensures sufficient resultant junction depth for the operation of the device not to be jeopardised by the removal of an upper part of the silicon during tungsten deposition. Similarly, for the P-dopant (i.e. boron) implant, this also provides a deeper P+ —region 42 which is enhanced by the rapid thermal anneal which drives the P-dopant deeper into the silicon substrate. In addition, this also gives a higher P+ —concentration at the interface with the tungsten which results in an improved electrical contact between the tungsten and the P+ —region which consequently lowers the contact resistance of the P+ —sources and drains. The rapid thermal anneal actuates the implant without causing diffusion of the implant. This removes defects in the silicon lattice. The rapid thermal anneal also smooths out the BPSG interlevel dielectric layer which leads to improved tungsten deposition since the "window" through which the tungsten is deposited into the contact hole is wider at its entrance. Furthermore, the rapid thermal anneal step can cause at least partial recrystallisation of the silicon which can remove damage to the silicon caused by the earlier processing i.e. implantation steps.

Additionally, the present inventors believe that the precleaning and contact etching steps tend to minimize the occurrence of defects such as tunnelling by reducing impurities such as oxide impurities on the exposed regions of silicon which can promote defect formation.

In addition, the present invention provides a further advantage in that it can provide protection against etch damage to the tungsten contacts which can occur when defining the interconnect layer by removing the need for overlap of the metal interconnect layer over the contacts since the tungsten contacts are accurately aligned with respect to the sources and drains. The interconnect widths no longer need to overlap on either side of the contact to eliminate etch damage which can occur in the processes of the prior art.

In summary, the primary advantage of the present invention is that it can enable selectively deposited tungsten contact plugs to be integrated into standard CMOS process flows whilst minimizing the detrimental effects which were reported in the prior art resulting from CVD tungsten depositions on silicon substrates.

What we claim is:

1. A method of fabricating a tungsten contact in a semiconductor device, which method comprises the steps of:
   (a) providing an oxide layer on a region of a silicon substrate;
   (b) depositing a sealing dielectric layer over the oxide layer;
   (c) depositing an interlevel dielectric layer over the sealing layer;
   (d) etching through the interlevel dielectric layer, the sealing dielectric layer and oxide layer as far as the substrate thereby to form a contact hole and to expose said region;
   (e) implanting a dopant into said region whereby the implanted dopant is self-aligned to the contact hole;
   (f) thermally annealing the substrate;
   (g) selectively depositing tungsten in the contact hole; and
   (h) depositing an interconnect layer over the deposited tungsten contact.

2. A method according to claim 1, wherein the sealing dielectric layer is provided at the interface between the oxide layer and the silicon substrate thereby to prevent tungsten encroachment along the interface.

3. A method according to claim 1 wherein the sealing dielectric layer is composed of silicon nitride.

4. A method according to claim 1 wherein step (f) is a rapid thermal anneal.

5. A method according to claim 4 wherein the interlevel dielectric layer is composed of a reflowable material and further comprising the step, after depositing step (c), of heating the substrate and said layers thereby to reflow the interlevel dielectric layer.

6. A method according to claim 1 wherein said region is initially doped with a dopant of the same conductivity as the dopant which is implanted in step (e).

7. A method according to claim 1 further comprising the step, before depositing step (g), of precleaning the exposed region with an agent containing hydrofluoric acid and with a plasma treatment.

8. A method according to claim 1 wherein the semiconductor device is a CMOS device, and wherein a plurality of the tungsten contacts are fabricated over a plurality of said regions, said regions being divided into pairs of said regions, each pair of regions defining a source and a drain for a respective semiconductor element, and wherein a polysilicon gate is deposited on said oxide layer between each pair of source and drain regions.

9. A method according to claim 8, wherein a first pair of source and drain regions is initially doped with an N+dopant and is disposed in a P doped well in the substrate which is N doped, and during the implantation step (e) an N dopant is implanted into the first pair of source and drain regions, and wherein a second pair of source and drain regions is initially doped with a P+dopant and is disposed in the N doped substrate, and during the implantation step (e) a P dopant is implanted into the second pair of source and drain regions.

10. A method of fabricating a tungsten contact in a semiconductor device, which method comprises the steps of:
    (a) providing an oxide layer on a region of a silicon substrate;
    (b) depositing a dielectric layer over the oxide layer;
    (c) etching through the dielectric layer and the oxide layer as far as the substrate thereby to form a contact hole and to expose said region;
    (d) implanting a dopant into said region whereby the implanted dopant is self-aligned to the contact hole;
    (e) thermally annealing the substrate;
    (f) selectively depositing tungsten in the contact hole to form a tungsten contact; and
    (g) depositing an interconnect layer over the tungsten contact.

11. A method according to claim 10 wherein the thermal annealing is a rapid thermal anneal.

12. A method according to claim 10 wherein the dielectric layer comprises a lower sealing dielectric layer and an upper interlevel dielectric layer.

13. A method according to claim 12 wherein the sealing dielectric layer is provided at the interface between the oxide layer and the silicon substrate thereby to prevent tungsten encroachment along the interface.

14. A method according to claim 12 wherein the sealing dielectric layer is composed of silicon nitride and the interlevel dielectric layer is composed of a reflowable material.

15. A method according to claim 10 wherein said region is initially doped with a dopant of the same conductivity as the dopant which is implanted in step (d), and in step (d) the implantation is carried out so as to implant the dopant deeper into the substrate than the initial dopant.

16. A method according to claim 10 further comprising the step, before depositing step (f), of precleaning the exposed region with an agent containing hydrofluoric acid and with a plasma treatment.

17. A method according to claim 1 wherein the sealing dielectric layer is provided at the interface between the silicon substrate and the oxide layer so as to impede lateral diffusion of tungsten into said interface during deposition step (g).

18. A method according to claim 1 further comprising the step (i), after step (h), of etching the interconnect layer to form an interconnect layer portion over the tungsten contact, the interconnect layer portion being non-overlapping on sides of the contact.

19. A method according to claim 18 wherein in the etching step (i) the interconnect layer is etched with an etch system having a selectivity to tungsten so that less than 2000 Angstroms of tungsten is removed.

20. A method according to claim 3 wherein the oxide layer comprises a gate oxide layer and the sealing layer has a thickness of from 200 to 600 Angstroms.

21. A method according to claim 1 wherein encroachment of tungsten from the contact along the interface between the oxide layer and the silicon substrate is up to about 0.1 microns.

22. A method according to claim 12 wherein the sealing dielectric layer is provided at the interface between the silicon substrate and the oxide layer so as to impede lateral diffusion of tungsten into said interface during deposition step (f).

23. A method according to claim 10, further comprising the step (h), after step (g), of etching the interconnect layer to form an interconnect layer portion over the tungsten contact, the interconnect layer portion being non-overlapping on sides of the contact.

24. A method according to claim 23 wherein in the etching step (h) the interconnect layer is etched with an etch system having a selectivity to tungsten so that less than 2000 Angstroms of tungsten is removed.

25. A method according to claim 12 wherein the sealing layer comprises silicon nitride.

26. A method according to claim 12 wherein the oxide layer comprises a gate oxide layer and the sealing layer has a thickness of from 200 to 600 Angstroms.

27. A method according to claim 10, wherein encroachment of tungsten from the contact along an interface between the oxide layer and the silicon substrate is up to about 0.1 microns.

* * * * *